United States Patent
Sanji

(10) Patent No.: US 10,334,769 B2
(45) Date of Patent: Jun. 25, 2019

(54) METHOD FOR ALLOCATING ELECTRONIC COMPONENT AND ELECTRONIC COMPONENT MOUNTING SYSTEM

(71) Applicant: FUJI CORPORATION, Chiryu-shi (JP)

(72) Inventor: Mitsuru Sanji, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 473 days.

(21) Appl. No.: 14/903,086

(22) PCT Filed: Jul. 9, 2013

(86) PCT No.: PCT/JP2013/068770
§ 371 (c)(1),
(2) Date: Jan. 6, 2016

(87) PCT Pub. No.: WO2015/004735
PCT Pub. Date: Jan. 15, 2015

(65) Prior Publication Data
US 2016/0150688 A1 May 26, 2016

(51) Int. Cl.
*H05K 13/04* (2006.01)
*H05K 13/08* (2006.01)
*G05B 19/418* (2006.01)

(52) U.S. Cl.
CPC ....... *H05K 13/08* (2013.01); *G05B 19/41865* (2013.01); *H05K 13/041* (2018.08);
(Continued)

(58) Field of Classification Search
CPC .............. H05K 13/08; H05K 13/0404; H05K 13/0408; H05K 13/0452; H05K 13/041; H05K 13/085
See application file for complete search history.

(56) References Cited

U.S. PATENT DOCUMENTS 6,842,974 B1 * 1/2005 Maenishi ........... H05K 13/0408
29/739

FOREIGN PATENT DOCUMENTS

JP 2008-071941 A 3/2008

OTHER PUBLICATIONS

International Search Report dated Aug. 20, 2013 for PCT/JP2013/068770 filed Jul. 9, 2013.

* cited by examiner

*Primary Examiner* — Livius Radu Cazan
(74) *Attorney, Agent, or Firm* — Oblon, McClelland, Maier & Neustadt, L.L.P.

(57) ABSTRACT

A method of allocating electronic components to be mounted to each of a plurality of nozzle holders provided on a mounting head is provided, in which the electronic component which does not have a usage record or the electronic component which is a test target is allocated to a nozzle holder which does not have operation restrictions. An electronic component mounting system is provided with a mounting head which is provided with a plurality of nozzle holders, each of which holds a suction nozzle, and a control device which allocates electronic components to be mounted to each of the plurality of nozzle holders. The control device includes an electronic component allocation section which allocates an electronic component which does not have a usage record or an electronic component which is a test target to a nozzle holder which does not have operation restrictions.

8 Claims, 3 Drawing Sheets

(52) U.S. Cl.
CPC ....... *H05K 13/0404* (2013.01); *H05K 13/085* (2018.08); *G05B 2219/34349* (2013.01)

METHOD FOR ALLOCATING ELECTRONIC COMPONENT AND ELECTRONIC COMPONENT MOUNTING SYSTEM

TECHNICAL FIELD

The present specification relates to a method of allocating electronic components to be mounted to each of a plurality of nozzle holders provided on a mounting head. The present specification further relates to an electronic component mounting system.

BACKGROUND ART

JP-A-2008-71941 discloses a method of allocating electronic components to be mounted to each of a plurality of nozzle holders provided on a mounting head. In this method, a process of allocating the electronic components to the plurality of nozzle holders is performed such that the electronic components which are allocated to adjacent nozzle holders do not interfere with each other.

SUMMARY

Whether the electronic components which are allocated to the plurality of nozzle holders interfere with each other is determined based on shape (dimension) data of the electronic components which is provided in advance. Ordinarily, for an electronic component which has a past usage record, it is confirmed that the shape (dimension) data of the electronic component is correctly set by image processing of the electronic component which is held by a suction nozzle. However, for a new electronic component which does not have a past usage record, the shape (dimension) data of the electronic component is generated based on a shape which is estimated from a diagram or CAD data, and it is possible that the shape (dimension) data which is provided in advance does not accurately reflect the actual shape of the electronic component. Therefore, there is a concern that, when a new electronic component which does not have a past usage record is treated in the same manner as another electronic component which has a past usage record, errors will arise in the mounting work, giving rise to situations such as adjustment work delays and discarding of the electronic component.

The present specification discloses technology which solves the problem described above. The present specification discloses technology capable of suppressing the occurrence of situations such as adjustment work delays and discarding of the electronic component which are caused by the shape (dimension) data of the electronic component being inaccurate when mounting a new electronic component which does not have a past usage record.

The present specification discloses a method of allocating electronic components to be mounted to each of a plurality of nozzle holders provided on a mounting head. In the method, the electronic component which does not have a usage record or the electronic component which is a test target is allocated to a nozzle holder which does not have operation restrictions.

According to the method described above, even if an error is detected during the mounting work that would have made it necessary to change the allocation of the electronic component to the nozzle holder by changing the shape (dimension) data of the electronic component which caused the error, since a new electronic component is allocated in advance to a nozzle holder which is not subject to operation restrictions, it is possible to mount the new electronic component which has already been picked up as is on a circuit board. Thus, it is possible to suppress the occurrence of situations such as adjustment work delays and discarding of the electronic component which accompany a change in nozzle operation. Here, the "usage record" includes, for example, information indicating whether image processing of the electronic component has been correctly completed in the electronic component mounting system. It is also possible to consider the electronic component to have a usage record if the target electronic component has already been mounted onto the circuit board in the mounting work. In the case of a mounting head which is provided with a plurality of nozzle holders, the "nozzle holder which does not have operation restrictions" may be the first nozzle holder which is allocated, for example. In this case, if the electronic component is allocated to only one nozzle holder, another electronic component and the electronic component will not interfere with each other. As described later, when there is a plurality of nozzle holder operation methods (1 nozzle operation, 2 nozzle operation, and the like), a nozzle holder which is used in common for each nozzle operation method may be used. In this case, it is not necessary to discard an electronic component as a result of changing the nozzle operation. Note that, in the method described above, it is possible to allocate not only an electronic component which does not have a usage record, but also an electronic component which is specified as a test target to a nozzle holder which does not have operation restrictions, even if the electronic component has a usage record.

Ordinarily, in the mounting work using the mounting head, the adherence of the electronic component to the suction nozzle, the image processing of the adhered electronic component, and the mounting of the electronic component to the circuit board are performed. Of the adherence, the image processing, and the mounting, if at least the image processing of the electronic component is completed correctly, it is considered that the shape (dimension) data of the electronic component is correctly set.

In the method described above, the usage record may be managed based on a combination of types of electronic component and imaging device.

For example, even given electronic components of the same shape (dimensions), it is possible that the manner in which the electronic components show in the captured images will differ slightly depending on the resolution of the imaging device which is used in the imaging. According to the method described above, it is possible to appropriately manage the usage record of the electronic components.

In the method described above, the usage record may be managed in electronic component reel units.

It is possible that the shapes (dimensions) of the electronic components will differ slightly between production lots of the electronic components. According to the method described above, it is possible to appropriately manage the usage record of the electronic components.

In the method described above, the nozzle holders which do not have operation restrictions may contain a nozzle holder capable of allocating an electronic component of a maximum size that the mounting head is capable of mounting.

The present specification also discloses an electronic component mounting system which is provided with a mounting head which is provided with a plurality of nozzle holders, each of which holds a suction nozzle, and a control device which allocates electronic components to be mounted to each of the plurality of nozzle holders. In the electronic component mounting system, the control device includes an electronic component allocation section which allocates an electronic component which does not have a usage record or an electronic component which is a test target to a nozzle holder which does not have operation restrictions.

According to the electronic component mounting system described above, even if an error is detected during the mounting work that would have made it necessary to change the allocation of the electronic component to the nozzle holder by changing the shape (dimension) data of the electronic component which caused the error, since a new electronic component is allocated in advance to a nozzle holder which is not subject to operation restrictions, it is possible to mount the new electronic component which has already been picked up as is on a circuit board. It is possible to suppress the occurrence of situations such as adjustment work delays and discarding of the electronic component which accompany a change in nozzle operation.

The electronic component mounting system described above may further include an electronic component mounting machine which is provided with the mounting head, in which the electronic component mounting machine may be provided with the electronic component allocation section.

Ordinarily, in each electronic component mounting machine of a mounting line, the allocation of the electronic components to each nozzle holder is performed by the production management computer. The allocation process is performed assuming that the shape (dimension) data of the electronic components is correct regardless of the presence or absence of usage records of the electronic components such that the work efficiency in the overall mounting line is optimal. Performing a re-allocation process in the overall mounting line using the production management computer every time the usage record of the electronic component changes is not practical. According to the electronic component mounting system described above, in the electronic component mounting machine, it becomes possible to adopt the allocation in the production management computer as is for an electronic component which has a usage record, and to support an electronic component which does not have a usage record by temporarily changing the allocation.

The electronic component mounting system described above may further include a mounting line which is provided with a plurality of electronic component mounting machines, each of which is provided with the mounting head, and a production management computer which manages the mounting line, in which the production management computer is provided with a usage record memory section which stores usage record data of electronic components.

Ordinarily, the production management computer manages information such as the identification numbers of the electronic components, and the shape (dimension) data of the electronic components. According to the electronic component mounting system described above, since the production management computer also manages the usage record data of the electronic components, the management of the data becomes easier.

DESCRIPTION OF EMBODIMENTS

Example

Figure 1:
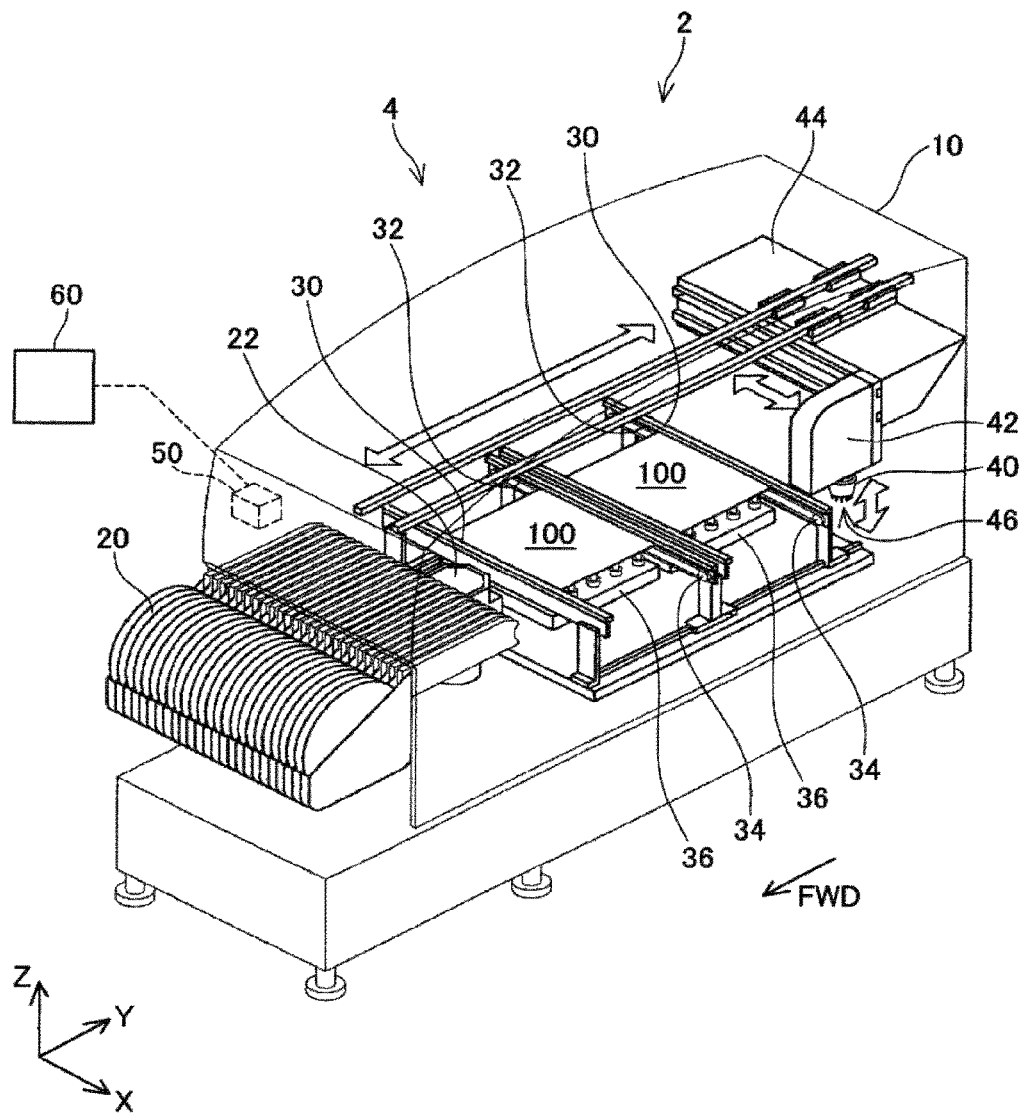
FIG. 1 is a perspective diagram schematically illustrating the configuration of an embodiment, electronic component mounting system 2.

Description will be given of an embodiment, electronic component mounting system 2, with reference to the drawings. The electronic component mounting system 2 is provided with a mounting machine 10. The mounting machine 10 is a device which mounts electronic components on a circuit board 100. The mounting machine 10 is also referred to as a surface mounting machine or a chip mounting machine. The mounting machine 10 is lined up in the left-right direction together with a solder printer (not depicted in the drawings), another mounting machine (not depicted in the drawings), and a board inspection machine (not depicted in the drawings) to form a lined-up mounting line 4.

The mounting machine 10 is provided with a plurality of component supply devices 20. The plurality of component supply devices 20 are attached to the front portion of the mounting machine 10. Each of the component supply devices 20 stores a plurality of electronic components and sequentially supplies the electronic components to the mounting head 40. The component supply device 20 of the present example is a tape-type component supply device in which a plurality of electronic components is stored in carrier tape. However, the component supply device 20 may be a tray-type component supply device which stores a plurality of electronic components on a tray.

The mounting machine 10 is provided with two board conveyance devices 30. Each of the board conveyance devices 30 conveys the circuit board 100 using a pair of conveyor belts 32 (one of which is not depicted in the drawings). Each of the conveyor belts 32 is supported by a pair of pulleys 34. In the mounting line 4, the board conveyance devices 30 of the mounting machine 10 are connected in series to the board conveyance devices of another device which is adjacent. Therefore, the circuit board 100 is conveyed across a plurality of devices in the order of a some printer, a plurality of the mounting machines 10, and the board inspection machine. The circuit board 100 is conveyed to a predetermined position in the mounting machine 10 by the board conveyance device 30, and is subsequently supported at a predetermined height by a board support device 36. Note that, in the description hereinafter, the transport direction of the circuit board 100 in the mounting line 4 (that is, the transport direction of the circuit board 100 in the mounting machine 10) is the X direction, a direction which orthogonally intersects the X direction in a horizontal plane is the Y direction, and the vertical direction is the Z direction.

The mounting machine 10 is provided with the mounting head 40. The mounting head 40 is of a rotary type and is held in a head holder 42 to be capable of rotating around the Z axis. The head holder 42 is capable of moving in the X direction and the Y direction of the inner portion of the mounting machine 10 due to an XY conveyance mechanism 44. The plurality of nozzle holders 46 is attached to the mounting head 40. A plurality of suction nozzles 48 is attached to the corresponding respective plurality of nozzle holders 46. The plurality of nozzle holders 46 is capable of sliding the corresponding respective plurality of suction nozzles 48 in the Z direction in relation to the mounting head 40. The distal end of the plurality of suction nozzles 48 can pick up an electronic component using negative pressure. It is possible to switch the supply of negative pressure to the distal end of the plurality of suction nozzles 48 in the mounting head 40 on and off. Therefore, the mounting head 40 is capable of picking up the electronic components which are supplied by the plurality of component supply devices 20 using the plurality of suction nozzles 48, and is also capable of mounting the electronic components which are adhered to the plurality of suction nozzles 46 onto the circuit board 100. A camera (imaging device) 22 images, from below, the mounting head 40 in a state in which the electronic components are held by the plurality of suction nozzles 48. The mounting head 40 transports the electronic components to the circuit board 100 on the board conveyance device 30 and mounts the electronic components in determined positions and orientations.

The control device 50 controls the operations of the various constituent elements of the mounting machine 10 such as the board conveyance device 30, the mounting head 40, the head holder 42, the XY conveyance mechanism 44, and the nozzle holder 46. The control device 50 is capable of communicating with a production management computer 60. The production management computer 60 manages the operations of the entirety of the mounting line 4 including the mounting machine 10. The production management computer 60 is provided with a usage record memory section which stores record data relating to the mounting work which has been performed in the past in the mounting line 4.

Before the mounting work of the electronic components in the mounting line 4, information relating to the circuit board 100 to be handled in the mounting work and information relating to the electronic components to be mounted to the circuit board 100 by the mounting machine 10 are transmitted to the control device 50 of the mounting machine 10 from the production management computer 60. The information relating to the electronic components to be mounted includes information such as an identification number of the electronic component, the shape (dimension) data of the electronic component, an identification number of the component supply device 20 which supplies the electronic component, and the identification number of the nozzle holder 46 to which the electronic component is allocated.

Figure 2:
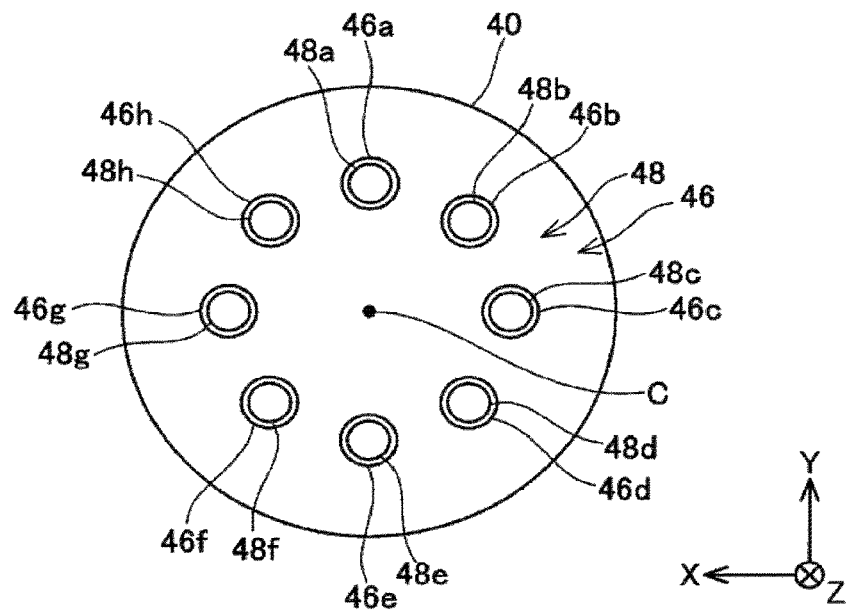
FIG. 2 is a diagram illustrating the arrangement of a plurality of nozzle holders 46 in a mounting head 40 of the embodiment.

As illustrated in FIG. 2, the plurality of nozzle holders 46 is arranged on the mounting head 40 in a predetermined pattern. In the present example, eight nozzle holders 46a, 46b, 46c, 46d, 46e, 46f, 46g, and 46h are arranged on the mounting head 40 equidistantly on a circular circumference around a rotating shaft C of the mounting head 40.

In the mounting head 40, when picking up the electronic components with each of the suction nozzles (for example, a suction nozzle 48a and a suction nozzle 48b) of adjacent nozzle holders (for example, the nozzle holder 46a and the nozzle holder 46b), it is necessary to ensure that the picked up electronic components do not interfere with each other. Therefore, when performing a process of allocating the electronic components to the plurality of nozzle holders 46, from the shape (dimension) data of each of the electronic components, the size of the electronic components is identified, and the production management computer 60 performs the process of allocating the electronic component to the plurality of nozzle holders 46 such that the electronic components which are picked up by the suction nozzles of the adjacent nozzle holders do not interfere with each other.

In the mounting head 40, when handling electronic components of a comparatively large size, it is possible to prevent the interference between the electronic components by restricting the number of the nozzle holders to use. For example, it is possible to prevent the interference of an electronic component of a comparatively large size with another electronic component by allocating an electronic component to one of the nozzle holders which are adjacent to each other (for example, the nozzle holder 46a) and not allocating an electronic component to the other (for example the nozzle holder 46b), that is, by not using the suction nozzle of the other nozzle holder to pick up an electronic component.

Ordinarily, according to the allocation of the electronic components to the nozzle holders 46 which are specified by the production management computer 60, the control device 50 performs the operation of the nozzle holder 46 in the mounting head 40 in one of the modes of 8 nozzle operation, 4 nozzle operation, 2 nozzle operation, and 1 nozzle operation. In the 8 nozzle operation, electronic components are allocated to all of the nozzle holders 46a, 46b, 46c, 46d, 46e, 46f, 46g, and 46h. In the 4 nozzle operation, electronic components are allocated to the plurality of nozzle holders 46 such that one of the nozzle holders is used, and the other nozzle holder is not used, of the nozzle holders which are adjacent to each other. For example, in the 4 nozzle operation, while electronic components are allocated to the nozzle holders 46a, 46c, 46e and 46g, electronic components are not allocated to the nozzle holders 46b, 46d, 46f, and 46h, and these nozzle holders are not used. In the 2 nozzle operation, while electronic components are allocated to the two nozzle holders which are arranged most distanced from each other, for example, only the nozzle holders 46a and 46e, electronic components are not allocated to the nozzle holders 46b, 46c, 46d, 46f, 46g, and 46h, and these nozzle holders are not used. In the 1 nozzle operation, while an electronic component is allocated to one nozzle holder, for example, only the nozzle holder 46a, electronic components are not allocated to the nozzle holders 46b, 46c, 46d, 46e, 46f, 46g, and 46h, and these nozzle holders are not used. In the present example, the nozzle holder 46a is a nozzle holder to which an electronic component is allocated no matter which mode of nozzle operation is used. In other words, the nozzle holder 46a is a nozzle holder which is not subject to operation restrictions. The nozzle holder 46a may be a nozzle holder capable of being allocated an electronic component of a maximum size that the mounting head 40 is capable of mounting. The nozzle holder which is not subject to operation restrictions referred to here may be a nozzle holder (for example, the nozzle holder 46a described above) which is used in common for each nozzle operation method when there is a plurality of nozzle operation methods (for example, the 8 nozzle operation, the 4 nozzle operation, the 2 nozzle operation, and the 1 nozzle operation described above) in the target mounting head, for example. Alternatively, the nozzle holder which is not subject to operation restrictions referred to here may be a nozzle holder (for example, the nozzle holder 46a described above) which an electronic component is allocated to first in the target mounting head, for example.

When the production management computer 60 performs a process of allocating the electronic components to the plurality of nozzle holders 46 before the mounting work of the electronic components, the presence or absence of interference is determined based on the shape (dimension) data of the electronic components. At this time, regarding an electronic component has a past usage record, it is confirmed that the shape (dimension) data of the electronic component is correctly set. However, in the case of a new electronic component which does not have a past usage record, it is possible that the shape (dimension) data of the electronic component is not necessarily accurate. In this case, there is a concern that the production management computer 60 performs a process of allocating the electronic components to the plurality of nozzle holders 46 based on shape (dimension) data of the electronic components which is not accurate, leading to errors being detected in the subsequent mounting work, giving rise to situations such as adjustment work delays and discarding of the electronic component.

In the mounting machine 10 of the present example, the control device 50 is provided with an electronic component allocation section. The electronic component allocation section of the control device 50 checks the presence or absence of a usage record of an electronic component which is the mounting target, and with regard to a new electronic component which does not have a past usage record, the allocation of the electronic component is temporarily changed, and the electronic component is allocated to a nozzle holder (for example, the nozzle holder 46*a*) which is not subject to operation restrictions. In the mounting machine 10 of the present example, when allocating the new electronic component which does not have a past usage record to a nozzle holder (for example the nozzle holder 46*a*) which is not subject to operation restrictions, the electronic component allocation section of the control device 50 does not allocate other electronic components to the nozzle holders other than the aforementioned nozzle holder (for example, the nozzle holders 46*b*, 46*c*, 46*d*, 46*e*, 46*f*, 46*g*, and 46*h*), and does not use any of these nozzle holders. When the mounting operation (including the image processing) of the electronic component is completed correctly after temporarily changing the allocation of the electronic component, the allocation of the electronic components is returned to the original state. In other words, the subsequent mounting operations are performed according to the allocation of the electronic components to the nozzle holders 46 which are specified by the production management computer 60.

When, the changing of the allocation of the electronic components is performed as described above, even if an error is detected in the subsequent mounting work and the control device 50 selectively restricts the operation of the nozzle holders, since the new electronic component is allocated to the nozzle holder (for example, the nozzle holder 46*a*) which is not subject to operation restrictions, it is possible to mount the electronic component to the circuit board 100 without discarding the new electronic component which has already been picked up. Since none of the nozzle holders (for example, the nozzle holders 46*b*, 46*c*, 46*d*, 46*e*, 46*f*, 46*g*, and 46*h*) other than the nozzle holder (for example, the nozzle holder 46*a*) to which the new electronic component is allocated are used, even if an error is detected during the mounting work and the control device 50 selectively restricts the operation of the nozzle holders, the other electronic components will not be discarded.

In the above description, description is given of a case in which the plurality of nozzle holders 46 in the mounting head 40 are formed of the eight nozzle holders 46*a*, 46*b*, 46*c*, 46*d*, 46*e*, 46*f*, 46*g*, and 46*h*; however, the number of nozzle holders is not limited thereto. The plurality of nozzle holders 46 may be formed of a smaller number of nozzle holders than 8, and may be formed of a greater number of nozzle holders than 8.

In the above description, description is given of a rotary type mounting head 40 as an embodiment; however, the mounting head 40 may adopt any mode as long as it is of an index type which is provided with the plurality of nozzle holders 46.

Figure 3:
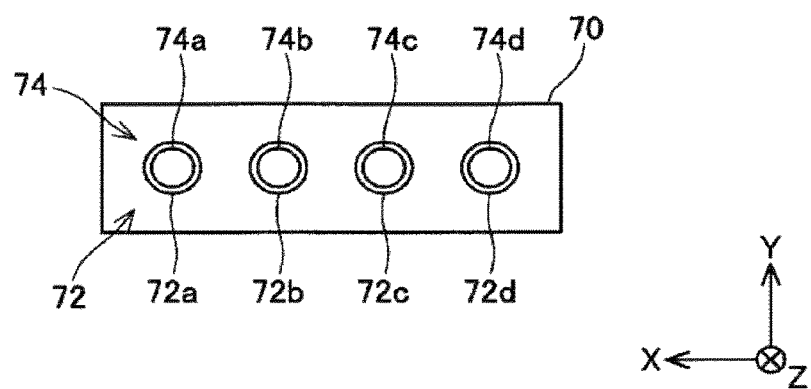
FIG. 3 is a diagram illustrating the arrangement of a plurality of nozzle holders 72 in a mounting head 70 of an alternative embodiment.
Figure 4:
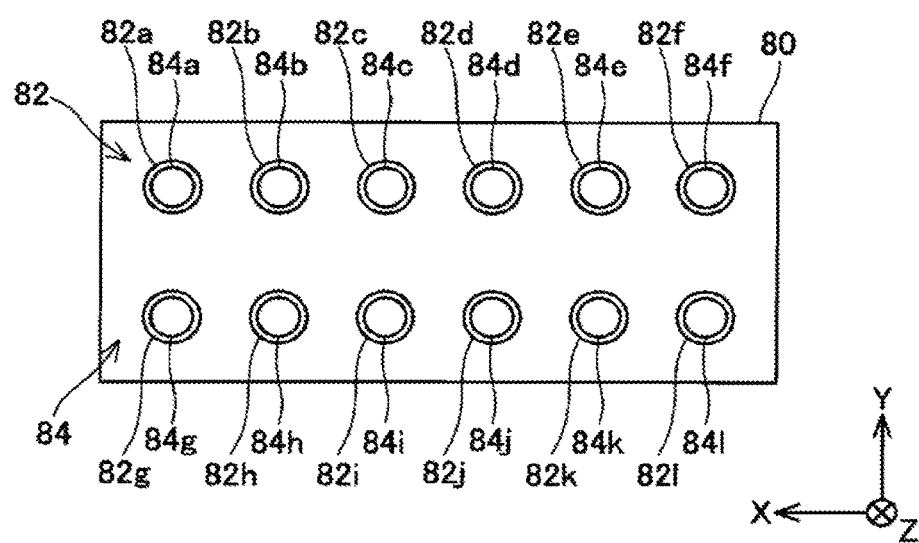
FIG. 4 is a diagram illustrating the arrangement of a plurality of nozzle holders 82 in a mounting head 80 of an alternative embodiment.

For example, as illustrated in FIG. 3 or FIG. 4, the mounting head 40 may be exchanged for the mounting head 70 or 80 in which the plurality of nozzle holders is arranged in a matrix. In the mounting head 70 illustrated in FIG. 3, four nozzle holders 72*a*, 72*b*, 72*c*, and 72*d* are arranged lined up in a row. Corresponding suction nozzles 74*a*, 74*b*, 74*c*, and 74*d* are attached to the respective nozzle holders 72*a*, 72*b*, 72*c*, and 72*d*. In the mounting head 80 illustrated in FIG. 4, twelve nozzle holders 82*a*, 82*b*, 82*c*, 82*d*, 82*e*, 82*f*, 82*g*, 82*h*, 82*i*, 82*j*, 82*k*, and 82*l* are arranged lined up in a 2×6 matrix. Corresponding suction nozzles 84*a*, 84*b*, 84*c*, 84*d*, 84*e*, 84*f*, 84*g*, 84*h*, 84*i*, 84*j*, 84*k*, and 84*l* are attached to the respective nozzle holders 82*a*, 82*b*, 82*c*, 82*d*, 82*e*, 82*f*, 82*g*, 82*h*, 82*i*, 82*j*, 82*k*, and 82*l*. In the mounting heads 70 and 80 also, it is possible to suppress the occurrence of situations such as adjustment work delays and discarding of the electronic component which are caused by the shape (dimension) data of the electronic component being inaccurate by allocating a new electronic component which does not have a usage record to a nozzle holder (for example, the nozzle holder 72*a*, 82*a*, or the like) which is not subject to operation restrictions.

A configuration may be adopted in which an operator of the mounting machine 10 can manually input whether the usage record of the electronic component is present or absent. Alternatively, a configuration may be adopted in which it is possible to automatically determine whether the usage record of the electronic component is present or absent in the production management computer 60 or the control device 50 of the mounting machine 10. When the control device 50 of the mounting machine 10 determines whether the usage record of the electronic component is present or absent, past actual data which is stored in the usage record memory section of the production management computer 60 is read out, thus it is determined whether the usage record of the target electronic component is present or absent.

For example, in a mounting machine of the same type as the mounting machine 10, when the mounting work has been performed correctly in the past using the electronic component, the control device 50 determines that the electronic component has a usage record. Alternatively, when the image processing of the electronic component has been completed correctly in the past using a camera of the same type as the camera 22, the control device 50 determines that the electronic component has a usage record.

For example, when the mounting work has been performed correctly in the past for an electronic component of the same type as the electronic component which is the target, the control device 50 determines that the electronic component has a usage record. Alternatively, when the mounting work has been performed in the past for an electronic component which is produced in the same lot as the electronic component which is the target, that is the electronic component which is supplied by the same reel as the electronic component which is the target, the control device 50 determines that the electronic component has a usage record. In the latter case, it is possible to suppress the occurrence of situations such as adjustment work delays and discarding of the electronic component which are caused by the shape (dimension) data of the electronic component being inaccurate, even when there is a difference between electronic components which, although are of the same type, are produced in different lots.

In the above description, description is given of a configuration in which the usage record memory section which stores past record data is provided in the production management computer 60; however, the usage record memory section may be provided in the control device 50 of the mounting machine 10.

In the above description, description is given of a configuration in which the electronic component allocation section which performs the process of allocating electronic components to the plurality of nozzle holders 46 is provided in the control device 50; however, the electronic component allocation section may be provided in the production management computer 60.

In the electronic component mounting system 2 of the embodiment, not limited to an electronic component which does not have a usage record, an electronic component which is a test target will be allocated to the nozzle holder which is not subject to operation restrictions even if it has a usage record. For example, when an operator wishes to perform testing, inspection, verification, adjustment, and the like of the shape (dimension) data of an electronic component on an electronic component which is a test target, the operator specifies the electronic component as a test target. In the electronic component mounting system 2 of the present example, when the electronic component which is the test target is specified, the electronic component is treated in the same manner as an electronic component which does not have a past usage record.

Detailed description was given of representative and non-limiting specific examples of the present disclosure with reference to the drawings. This detailed description is simply intended to illustrate the details for carrying out a preferable example of the present disclosure to a person skilled in the art, and is not intended to limit the scope of the present disclosure. The disclosed additional characteristics and the disclosure may be used separately from or together with other characteristics and disclosures in order to provide a further improved method and electronic component mounting system.

In the broadest meaning, the combinations of characteristics and steps disclosed in the detailed description given above are not essential when carrying out the present disclosure, and, in particular, are only described in order to explain the representative specific examples of the present disclosure. The various characteristics of the representative specific examples described above and the various elements described in the claims do not need to be combined in the manner of the specific examples described herein or in the recited order for the provision of the additional and useful embodiments of the present disclosure.

Separately from the characteristics which are described in the examples and/or the claims, all of the characteristics which are described in the present specification and/or the claims are intended to separately and independently limit the disclosure at the time of application and the specific items described in the claims. Description relating to all numerical ranges and groups or collections are made with the intention to disclose intermediate configurations as restrictions to the disclosure at the time of application and the specific items described in the claims.

Detailed description of specific examples of the present disclosure are given hereinabove; however, these are merely exemplary and do not limit the claims. The technology described in the claims includes various modifications and changes to the specific examples which are given above. The technical elements described in the present specification or the drawings exhibit technical usefulness on their own or in various combinations, and are not limited to the combinations described in the claims at the time of application. The technology exemplified in the present specification or the drawings may be achieved at the same time as a plurality of objects, and the achievement of one of these objects in itself has technical usefulness.

The invention claimed is:

1. An electronic component mounting method, comprising:
   storing, in a memory, usage records corresponding to electronic components, each usage record indicating image processing of a corresponding electronic component;
   allocating the electronic components to be mounted to a selected number of a plurality of nozzle holders provided on a mounting head, the selected number based on a plurality of nozzle operation methods;
   attaching the allocated electronic components to a plurality of suction nozzles, which are attached to the selected number of nozzle holders; and
   mounting the attached electronic components onto a circuit board,
   wherein when an electronic component does not have a corresponding usage record stored in the memory or is a test target, the electronic component is allocated to a nozzle holder which is used in common for each of the plurality of nozzle operation methods.

2. The method according to claim 1,
   wherein the usage records include at least a record in which image processing of the corresponding electronic component is correctly completed.

3. The method according to claim 1,
   wherein the usage records include information related to a combination of types of electronic component and imaging device.

4. The method according to claim 1,
   wherein the nozzle holder that is used in common for each of the plurality of nozzle operation methods is configured to be allocated an electronic component of a maximum size that the mounting head is configured to mount.

5. The method according to claim 1, wherein the nozzle holder that is used in common for each of the plurality of nozzle operation methods is a nozzle holder to which an electronic component is allocated first in the mounting head.

6. An electronic component mounting system, comprising:
   a mounting head which is provided with a plurality of nozzle holders, each of which holds a suction nozzle;
   a control device that is configured to allocate electronic components to be mounted to a selected number of the plurality of nozzle holders, the selected number based on a plurality of nozzle operation methods; and
   a memory that is configured to store usage records corresponding to the electronic components, each usage record indicating image processing of a corresponding electronic component;
   wherein the control device is configured to allocate an electronic component which does not have a corresponding usage record stored in the memory or is a test target to the nozzle holder which is used in common for each of the plurality of nozzle operation methods.

7. The electronic component mounting system according to claim 6, further comprising:

an electronic component mounting machine which is provided with the mounting head,
wherein the electronic component mounting machine is provided with the control device.

8. The electronic component mounting system according to claim 6, further comprising:
a mounting line which is provided with a plurality of electronic component mounting machines, each of which is provided with the mounting head; and
a production management computer which manages the mounting line.

\* \* \* \* \*